United States Patent [19]
Miura et al.

[11] Patent Number: 5,250,836
[45] Date of Patent: Oct. 5, 1993

[54] SEMICONDUCTOR DEVICE HAVING SILICON-ON-INSULATOR STRUCTURE

[75] Inventors: Takao Miura, Tokyo; Kazunori Imaoka, Komae, both of Japan

[73] Assignee: Fujitsu Limited, Kawasaki, Japan

[21] Appl. No.: 975,897

[22] Filed: Nov. 12, 1992

Related U.S. Application Data

[63] Continuation of Ser. No. 870,238, Apr. 20, 1992, abandoned, which is a continuation of Ser. No. 627,197, Dec. 13, 1990, abandoned.

[30] Foreign Application Priority Data

Dec. 20, 1989 [JP] Japan ................................. 1-328303

[51] Int. Cl.$^5$ .......................................... H01L 27/12
[52] U.S. Cl. .................................. 257/506; 257/510; 257/513; 257/374; 257/635
[58] Field of Search .................. 357/49, 55, 54, 59; 257/374, 501, 506, 510, 513, 635

[56] References Cited

U.S. PATENT DOCUMENTS

| | | | |
|---|---|---|---|
| 4,261,791 | 4/1981 | Shwartzman | 156/628 |
| 4,870,475 | 9/1989 | Endo et al. | 357/49 |
| 4,907,063 | 3/1990 | Okada et al. | 357/49 |
| 4,951,102 | 8/1990 | Beitman et al. | 357/49 |

FOREIGN PATENT DOCUMENTS 296754 12/1988 European Pat. Off. .
0335741 10/1989 European Pat. Off. .

OTHER PUBLICATIONS

*Dielectrically Isolated Intelligent Power Switch*, Yu Ohata and Takao Izumita, Proceedings of the IEEE 1987 Custom Integrated Circuits Conference, May 4–7, 1987, pp. 443–446.

*Process He: A Highly Advanced Trench Isolated Bipolar Technology for Analogue and digital Applications*, P. C. Hunt and M. P. Cooke, IEEE 1988 Custom Integrated Circuits Conference, May 16–19, 1988, pp. 22.2.1–22.2.4.

*Suitable Trench Shape for Dielectric Isolation*, K. D. Beyer, B. M. Kemlage and D. J. Schepis, IBM Technical Disclosure Bulletin, vol. 27, No. 5, Oct., 1984, pp. 3068–3070.

*The Use of Multiple Oxygen Implants for Fabrication of Bipolar Silicon-On-Insulator Integrated Circuits*, Dale G. Platteter, Tom F. Cheek, Jr., IEEE Trans. on Nuclear Science (1988) Dec., vol. 35, No. 6, pp. 1350–1354.

*Improvements of Trench Capacitor Characteristics by Pre-Oxidation Surface Cleaning with a $HNO_3$-$HF$-$H_2O$ Solution*, A. Ohsawa, R. Takizawa, K. Honda, T. Matsutani and K. Imaoka, International Electron Devices Meeting (IEEE 1988), Dec. 11–14, 1988, pp. 726–729.

*Acid Mixture for Cleaning Wafers with Already Existing Circuit Structures* M. Briska and K. P. Thiel, IBM Technical Disclosure Bulletin, vol. 18, No. 8, Jan., 1976, p. 2553.

*Method of Reducing the Arsenic Doping in Silicon*, W. Hoffmeister, A. Schmitt and H. Schumacher, IBM Technical Disclosure Bulletin, vol. 22, No. 8A, Jan., 1980, p. 3255.

Patent Abstracts of Japan, vol. 6, No. 47 (E-99) (925) 26 Mar. 1982 JP-A-56 161 638 (Fujitsu K.K.) 12 Dec. 1981.

Patent Abstracts of Japan, vol. 12, No. 189 (E-616) (3036) 2 Jun. 1988 JP-A-62 293 759 (Matsushita Electric Ind Co Ltd) 21 Dec. 1987.

Primary Examiner—Edward Wojciechowicz
Attorney, Agent, or Firm—Staas & Halsey

[57] ABSTRACT

A semiconductor device includes a first substrate made of a semiconductor, a first insulator layer which is formed on the first substrate, second substrate made of a semiconductor and formed on the first insulator layer, a trench which extends from a top surface of the second substrate to at least a part of the first insulator layer, and a second insulator layer which substantially defines a side wall of the trench.

19 Claims, 11 Drawing Sheets

SEMICONDUCTOR DEVICE HAVING SILICON-ON-INSULATOR STRUCTURE

This application is a continuation of application Ser. No. 07/870,238, filed Apr. 20, 1992, now abandoned, which is a continuation of co-pending application Ser. No. 627,197 filed on Dec. 13, 1990, now abandoned.

BACKGROUND OF THE INVENTION

The present invention generally relates to semiconductor devices having a silicon-on-insulator (SOI) structure and production methods thereof, and more particularly to a semiconductor device having an SOI structure with a trench and a production method thereof.

In a semiconductor device which uses the SOI structure, it is possible to completely isolate elements using a trench isolation structure. For this reason, it is possible to improve the resistance against radioactive rays, prevent latch up, and increase the operation speed by the reduced substrate capacitance.

However, when a trench is formed in the SOI substrate, a crystal characteristic and an electrical characteristic of the semiconductor device deteriorate. Particularly in the case where the SOI substrate is formed by bonding two substrates, the characteristic deterioration is more likely to occur.

A description will be given of a conventional method of forming a trench in an SOI substrate which is formed by bonding, by referring to FIG. 1. FIG. 1 shows a cross section of an essential part of a semiconductor device which is made up of the SOI substrate.

The semiconductor device shown in FIG. 1 includes an active substrate 1 which is made of silicon (Si) and in which elements of the semiconductor device are formed, a first insulator layer 2 which is formed on the side of the active substrate 1 is made of silicon dioxide ($SiO_2$), a base substrate 3 which is made of Si, a second insulator layer 4 which is formed on the side of the base substrate 3 is made of $SiO_2$, and a trench 5. The first and second insulator layers 2 and 4 are bonded at a bonding surface 6.

When producing the semiconductor device shown in FIG. 1, the following steps are taken.

(1) The first insulator layer 2 is formed on a surface of the active substrate 1, while the second insulator layer 4 is formed on a surface of the base substrate 3.

(2) The active substrate 1 and the base substrate 3 are bonded by bonding the first and second insulator layers 2 and 4 together.

(3) The other surface of the active substrate 1 is polished to an appropriate thickness. For example, the appropriate thickness is in the range of 1 to 10 $\mu m$.

(4) A resist process of a normal photolithography technique and a dry etching using $Cl_2$ as the etching gas for etching Si or $CF_4 + CHF_3$ as the etching gas for etching $SiO_2$ are used to form the trench 5 by selectively etching the active substrate 1 and the first and second insulator layers 2 and 4. At this stage, the trench 5 generally maintains the pattern which is determined by a photoresist mask which is formed during the resist process.

(5) A fluorine chemical is used to remove the etching residue or damage caused by the etching carried out in the step (4). By this step (5), the first and second insulator layers 2 and 4 are subjected to side etching and the trench 5 becomes spread at the lower part as shown in FIG. 1.

The step (5) must be carried out to remove the damage caused by the etching in the step (4), because the damage will diffuse further into the active substrate 1. When such damage diffuses further into the active substrate 1, the characteristic of elements formed in a vicinity of the trench 5 will deteriorate. On the other hand, when elements are not formed in the vicinity of the trench 5, the integration density of the semiconductor device becomes poor.

Therefore, according to the conventional method, the step (5) which uses the fluorine chemical must be carried out after forming the trench 5 by the step (4). But because of the step (5), the first and second insulator layers 2 and 4 are subjected to the side etching and an overhang part 1A is formed in the active substrate 1.

When the overhang part 1A exists in the active substrate 1, stress and electric field concentrate at a corner 1B of the overhang part 1A to cause crystal defects and insulation breakdown.

In addition, in the case of the bonded SOI substrate in particular, the active substrate 1 and the base substrate 3 may separate from each other at the bonding surface 6 while the fluorine chemical is used to remove the etching residue or damage caused by the etching.

SUMMARY OF THE INVENTION

Accordingly, it is a general object of the present invention to provide a novel and useful semiconductor device and production method thereof, in which the problems described above are eliminated.

Another and more specific object of the present invention is to provide a semiconductor device comprising a first substrate made of a semiconductor, a first insulator layer which is formed on the first substrate, a second substrate made of a semiconductor and formed on the first insulator layer, where the second substrate has a top surface, a trench which extends from the top surface of the second substrate to at least a part of the first insulator layer, where the trench has a sidewall, and a second insulator layer which substantially defines the side wall of the trench. According to the semiconductor device of the present invention, the second substrate does not overhang with respect to the first insulator layer, and for this reason, no stress and no electric field are concentrated at the second substrate. As a result, the generation of crystal defect and leak current is positively prevented, thereby making it possible to form elements having satisfactory characteristics in the second substrate which is used as the active substrate.

Still another object of the present invention is to provide a method of producing a semiconductor device comprising a step of preparing a stacked structure including a first substrate, a first insulator layer formed on the first substrate and a second substrate formed on the first insulator layer, a step of forming a trench which extends from a top surface of the second substrate to at least a part of the first insulator layer, where the trench has a sidewall defined by a damage layer and a side surface of the first insulator layer exposed within the trench and the damage layer is generated on at least the second substrate exposed within the trench due to the formation of the trench, a step of removing the damage layer within the trench, and a step of forming a second insulator layer within the trench excluding the side surface of the first insulator layer so that a surface of the second insulator layer exposed within the trench substantially matches the side surface of the first insulator layer. According to the method of producing the semiconductor device of the present invention, the second substrate does not overhang with respect to the first insulator layer, and for this reason, no stress and no electric field are concentrated at the second substrate. As a result, the generation of crystal defect and leak current is positively prevented, thereby making it possible to form elements having satisfactory characteristics in the second substrate which is used as the active substrate.

Other objects and further features of the present invention will be apparent from the following detailed description when read in conjunction with the accompanying drawings.

DESCRIPTION OF THE PREFERRED EMBODIMENTS

Figure 1:
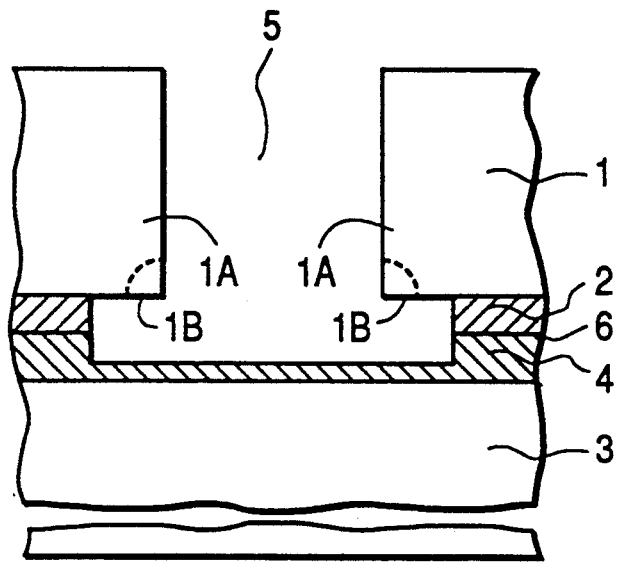
FIG. 1 is a cross sectional view showing an essential part of a semiconductor device for explaining a conventional method of forming a trench in a SOI structure.
Figure 2:
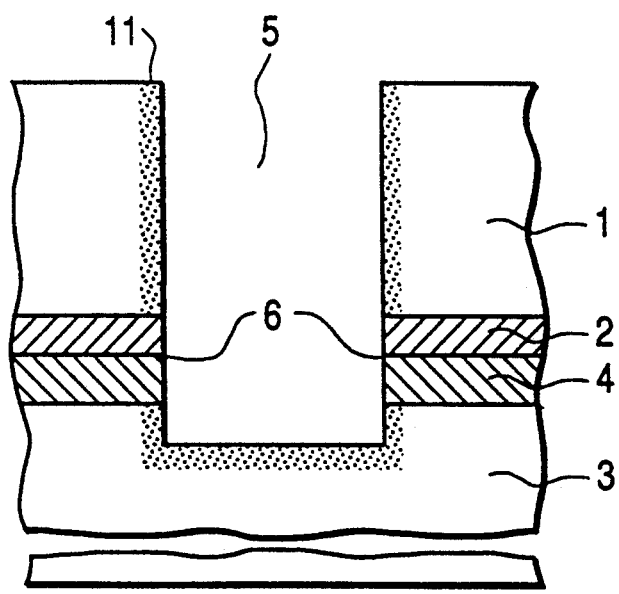
FIGS. 2 through 4 are cross sectional views respectively showing essential parts of a first embodiment of a semiconductor device according to the present invention at important stages of a first embodiment of a production method according to the present invention.
Figure 3:
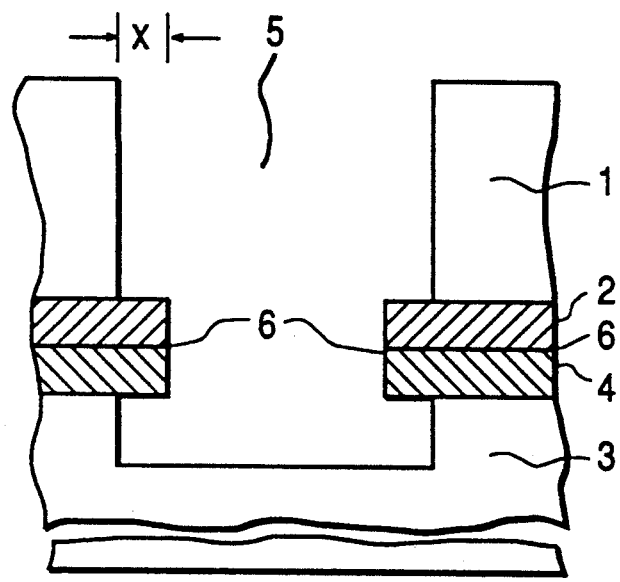
Figure 4:
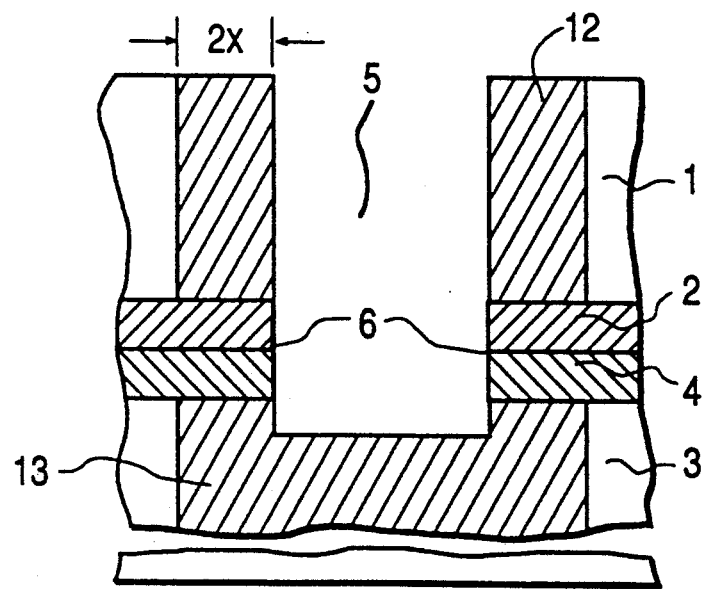

First, a description will be given of a first embodiment of a production method according to the present invention for producing a first embodiment of a semiconductor device according to the present invention, by referring to FIGS. 2 through 4. FIGS. 2 through 4 respectively show essential parts of the semiconductor device at important stages of the production method. In FIGS. 2 through 4, those parts which are the same as those corresponding parts in FIG. 1 are designated by the same reference numerals, and a description thereof will be omitted.

Step 2-(1)

In FIG. 2, a known method is used to prepare an active substrate 1 which is made of Si and a base substrate 3 which is also made of Si. An insulator layer 2 which is made of $SiO_2$ and having a thickness of approximately 0.5 $\mu$m is formed on the active substrate 1, while an insulator layer 4 which is made of $SiO_2$ and having a thickness of approximately 0.5 $\mu$m is formed on the base substrate 3. The active substrate 1 and the base substrate 3 are bonded together by bonding the insulator layers 2 and 4 at a bonding surface 6. For example, the thicknesses of the insulator layers 2 and 4 may be selected in a range of 0.1 $\mu$m to 10 $\mu$m.

Step 2-(2)

For example, lapping and polishing techniques are used to reduce the thickness of the active substrate to approximately 1 $\mu$m.

Step 2-(3)

A resist process of a photolithography technique and a reactive ion etching (RIE) using as an etching gas $Cl_2$ for etching Si or $CF_4+CHF_3$ for etching $SiO_2$ are used to etch the active substrate 1, the insulator layers 2 and 4, and the base substrate 3. A trench 5 which extends from the surface of the active substrate 1 to within the base substrate 3 is formed by this etching.

However, a damage layer 11 is generated at the surfaces of the active substrate 1 and the base substrate 3 which are exposed within the trench 5.

Step 3-(1)

In FIG. 3, a wet etching using $HF/HNO_3$ as an etchant, for example, is used to remove the damage layer 11 by the etching. When the etching quantity is x as shown in FIG. 3, x=500 Å, for example.

By the above described process, only the active substrate 1 and the base substrate 3 which are made of Si are etched, and the insulator layers 2 and 4 are virtually unaffected by the etching. For this reason, the insulator layers 2 and 4 will not separated from each other at the bonding surface 6.

Only the Si substrates 1 and 3 may be etched by using any of the following as the etchant.

| |
|---|
| $HF/HNO_3/H_2O_2/Br_2$ |
| $HF/HNO_3/H_2O_2/CrO_3$ |
| $HF/HNO_3 H_2O_2/H_2SO_4$ |
| $HF/HNO_3/H_2O_2$ |
| $HF/HNO_3/H_3PO_4$ |
| $HF/H_3PO_4$ |

Only the $SiO_2$ insulator layers 2 and 4 may be etched by using any of the following as the etchant, however, such etchants are unsuited for removing the damage layer 11 since only the Si substrates 1 and 3 are to be etched in this case.

| |
|---|
| $H_2O/HF$ |
| $H_2O/HF/H_3PO_4$ |
| $H_2O/HF/NH_4F$ |
| Step 4-(1): |

In FIG. 4, a thermal oxidation is used to oxidize the inside of the trench 5 and form insulator layers 12 and 13 which are made of $SiO_2$. In this case, When the oxidation quantity is set to 2x, that is, two times the etching quantity of the substrates 1 and 3, the side wall within the trench 5 becomes approximately flat and the end portions of the insulator layers 2 and 4 will not notably project or recede from the side wall surface. Of course, 2x=1000 Å in this embodiment.

The trench 5 which is formed in the above described manner may be used for forming a device isolation structure. Alternatively, the trench 5 may be used for forming an information storage capacitor of a dynamic random access memory (DRAM).

After forming the trench 5, the insulator layers 2 and 4 are virtually not etched or not etched at all, and only the Si substrates 1 and 3 are etched. For this reason, no overhang part is formed in the active substrate 1 and the substrates 1 and 3 will not separated from each other at the bonding surface 6.

Figure 5:
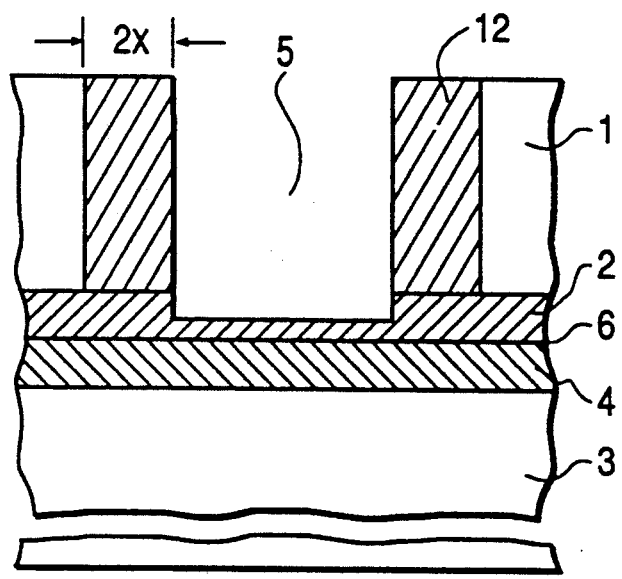
FIG. 5 is a cross sectional view showing an essential part of a second embodiment of the semiconductor device according to the present invention for explaining a second embodiment of the production method according to the present invention.

Next, a description will be given of a second embodiment of the production method and a second embodiment of the semiconductor device according to the present invention, by referring to FIG. 5. In FIG. 5, those parts which are the same as those corresponding parts in FIGS. 2 through 4 are designated by the same reference numerals, and a description thereof will be omitted. In this embodiment, the depth of the trench 5 does not exceed the bonding surface 6.

In this case, when the trench 5 is formed, the damage layer 11 is only generated at the side wall of the active substrate 1. Hence, it is possible to prevent the formation of an overhang part in the active substrate 1 by removing the damage layer 11 at the side wall of the active substrate 1 and thereafter forming the insulator layer 12 at the side wall of the active substrate 1. Of course, the substrates 1 and 3 will not separate at the bonding surface 6. In addition, the depth of the trench 5 may be selected to an arbitrary depth which exceeds the bonding surface 6 but does not penetrate the insulator layer 4.

Figure 6:
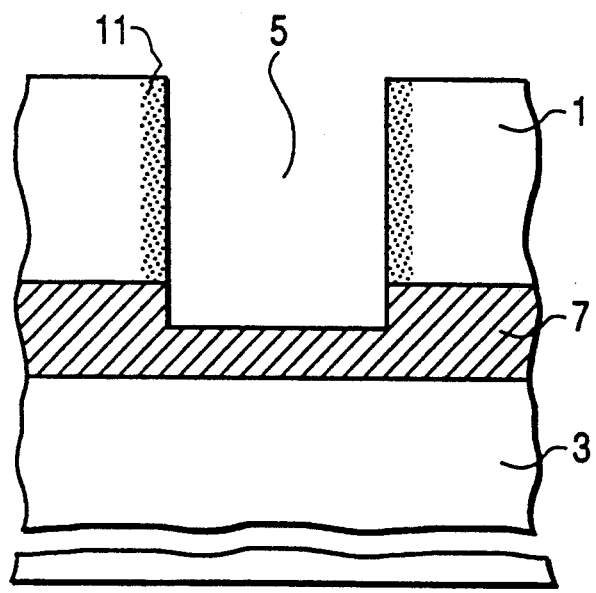
FIGS. 6 through 8 are cross sectional views respectively showing essential parts of a third embodiment of the semiconductor device according to the present invention at important stages of a third embodiment of the production method according to the present invention.
Figure 7:
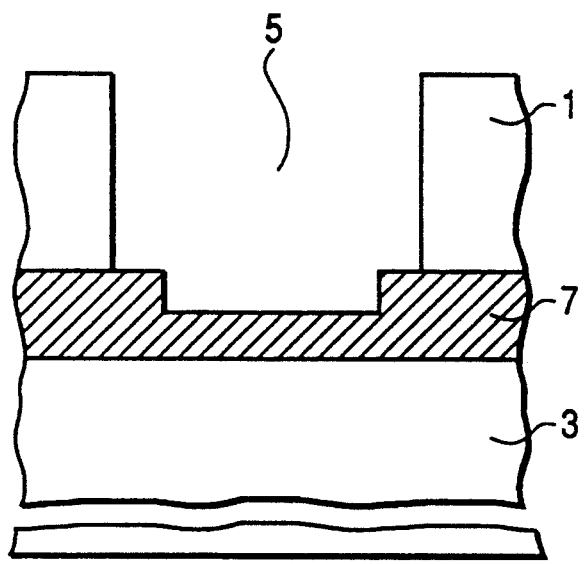
Figure 8:
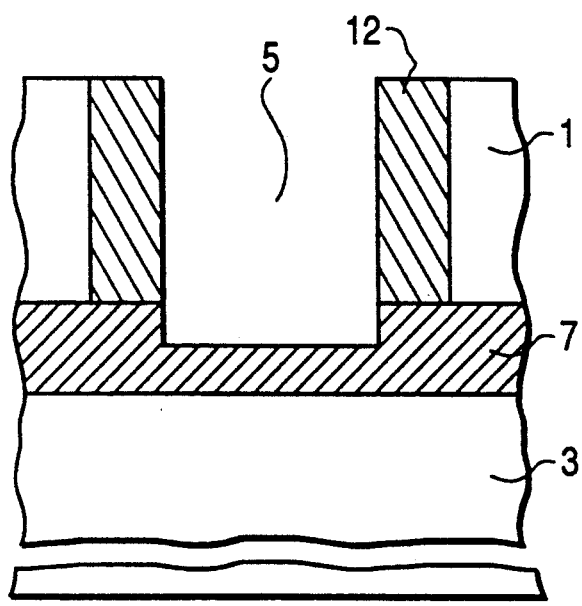

Next, a description will be given of a third embodiment of the production method and a third embodiment of the semiconductor device according to the present invention, by referring to FIGS. 6 through 8. FIGS. 6 through 8 respectively show essential parts of the semiconductor device at important stages of the production method. In FIGS. 6 through 8, those parts which are the same as those corresponding parts in FIGS. 2 through 4 are designated by the same reference numerals, and a description thereof will be omitted.

In this embodiment, the SOI substrate of the semiconductor device is not obtained by bonding two substrates as described above but is obtained by separation by implanted oxygen (SIMOX) or recrystallization.

Step 6-(1)

In FIG. 6, the SOI substrate which is obtained by SIMOX or recrystallization is prepared.

The SOI substrate which is obtained by SIMOX an insulator layer 7 which is made of $SiO_2$. This insulator layer 7 is obtained by implanting oxygen ions within a Si semiconductor substrate by controlling the acceleration energy and the like. For the sake of convenience, the top side of the Si semiconductor substrate which is separated by the insulator layer 7 is regarded as the active substrate 1 and the bottom side of the Si semiconductor substrate which is separated by the insulator layer 7 is regarded as the base substrate 3 in FIG. 6.

When forming the SOI substrate by the recrystallization, the $SiO_2$ insulator layer 7 and a polysilicon layer are stacked on the Si semiconductor substrate and subjected to an energy beam such as a laser beam so as to recrystallize the polysilicon layer into single crystal Si layer. For the sake of convenience, the single crystal Si layer is regarded as the active substrate 1 and the Si semiconductor substrate existing under the insulator layer 7 is regarded as the base substrate 3 in FIG. 6.

In this embodiment, the thickness of the active substrate 1 can be set to an appropriate thickness and there is no need to reduce the thickness of the active substrate 1 by the polishing or the like.

Step 6-(2)

The active substrate 1 and the insulator layer 7 are etched by the resist process of the photolithography technique and the RIE using $Cl_2$ or $CF_4+CHF_3$ as the etching gas, so as to form the trench 5 which extends from the surface of the active substrate 1 to within the insulator layer 7.

In this case, the damage layer 11 is also generated at the surface of the active substrate 1 exposed within the trench 5.

Step 7-(1)

In FIG. 7, a wet etching using HF/HNO$_3$ as the etchant is used to remove the damage layer by etching. For example, the etching quantity is approximately 500 Å.

Only the active substrate 1 which is made of Si is etched by the above described etching and the insulator layer 7 is virtually unaffected by the etching. For this reason, an overhang part will not be formed in the active substrate 1.

Step 8-(1)

In FIG. 8, a thermal oxidation is used to oxidize the inside of the trench 5 and form an insulator layer 12 which is made of SiO$_2$. In this case, when the oxidation quantity is set to two times the etching quantity with respect to the active substrate 1 in the step 7-(1), the side wall within the trench 5 becomes approximately flat and the end portion of the insulator layers 7 will not notably project or recede from the side wall surface. In this embodiment, the insulator layer 12 has a thickness of approximately 1000 Å, for example.

The trench 5 which is obtained in this embodiment may be used for forming a device isolation structure or an information storage capacitor of a DRAM, similarly as in the case of the trench 5 which is formed by the first and second embodiments.

Figure 9:
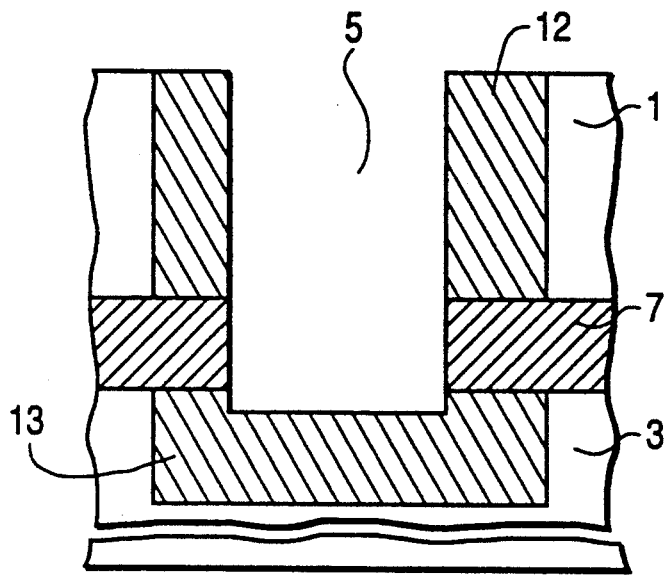
FIG. 9 is a cross sectional view showing an essential part of a fourth embodiment of the semiconductor device according to the present invention for explaining a fourth embodiment of the production method according to the present invention.

Next, a description will be given of a fourth embodiment of the production method and a fourth embodiment of the semiconductor device according to the present invention, by referring to FIG. 9. In FIG. 9, those parts which are the same as those corresponding parts in FIGS. 2 through 8 are designated by the same reference numerals, and a description thereof will be omitted.

In this embodiment, when the trench 5 is formed, the damage layer 11 is also generated at the side wall of the base substrate 3. Hence, similarly as in the case of the embodiment described with reference to FIGS. 2 through 4, the damage layer 11 at the side walls of the substrates 1 and 3 are removed and the insulator layers 12 and 13 are formed thereafter. Hence, it is possible to prevent the formation of an overhang part in the active substrate 1, and the substrates 1 and 3 will not separate.

Figure 10:
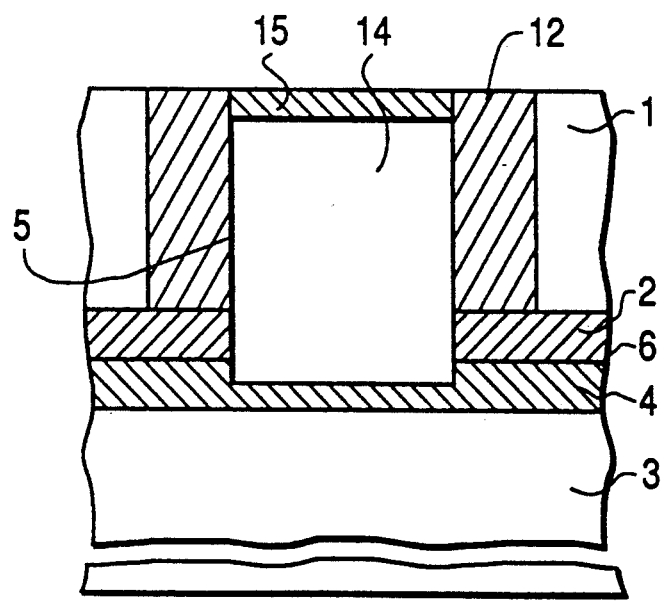
FIG. 10 is a cross sectional view showing an essential part of a fifth embodiment of the semiconductor device according to the present invention for explaining a fifth embodiment of the production method according to the present invention.

Next, a description will be given of a fifth embodiment of the production method and a fifth embodiment of the semiconductor device according to the present invention, by referring to FIG. 10. In FIG. 10, those parts which are the same as those corresponding parts in FIGS. 2 through 9 are designated by the same reference numerals, and a description thereof will be omitted.

In FIG. 10, a polysilicon layer 14 is filled inside the trench 5, and an insulator layer 15 which is made of SiO$_2$ covers the top of the polysilicon layer 14.

In this embodiment, the SOI substrate is obtained by bonding the insulator layers 2 and 4 of the respective substrates 1 and 3 at the bonding surface 6. The depth of the trench 5 exceeds the bonding surface 6 but does not reach the base substrate 3.

The trench isolation shown is the standard type which is often used in semiconductor devices.

Figure 11:
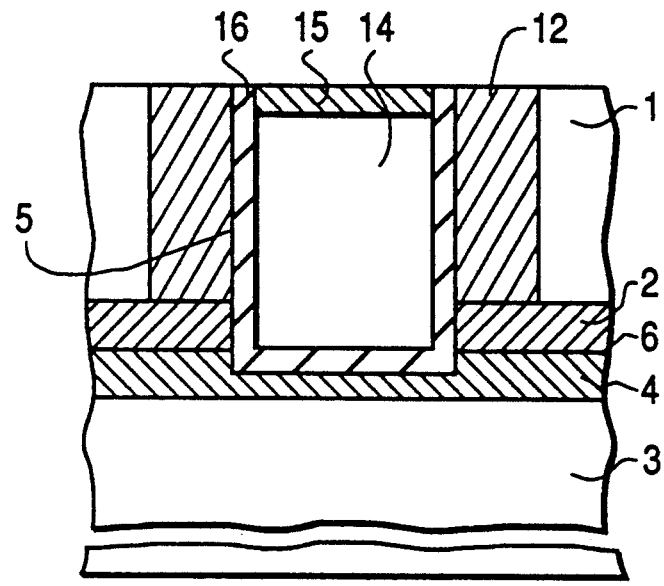
FIG. 11 is a cross sectional view showing an essential part of a sixth embodiment of the semiconductor device according to the present invention for explaining a sixth embodiment of the production method according to the present invention.

Next, a description will be given of a sixth embodiment of the production method and a sixth embodiment of the semiconductor device according to the present invention, by referring to FIG. 11. In FIG. 11, those parts which are the same as those corresponding parts in FIGS. 2 through 10 are designated by the same reference numerals, and a description thereof will be omitted.

In FIG. 11, an insulator layer 16 made of silicon nitride (Si$_3$N$_4$) is formed within the trench 5. The SOI substrate used in this embodiment is the same as that used in the fifth embodiment shown in FIG. 10, however, the inside of the trench 5 is covered by the insulator layer 16. By the provision of the insulator layer 16, the withstand voltage of the insulator layer and the resistance against stress are improved compared to the fifth embodiment.

Figure 12:
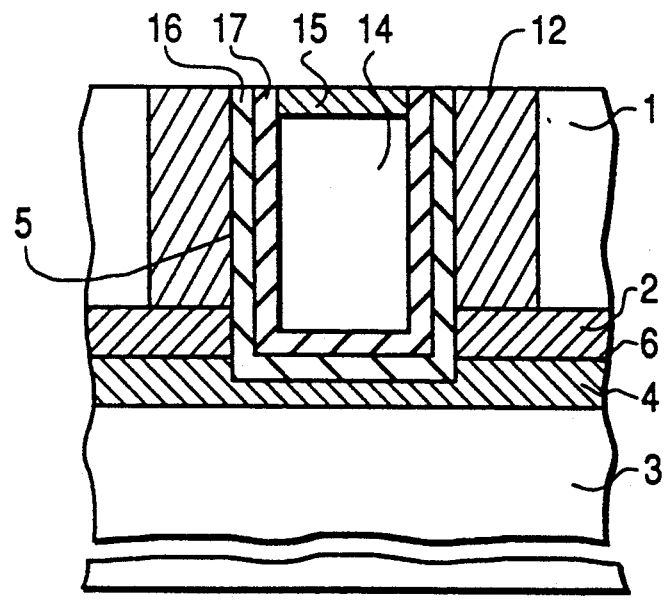
FIG. 12 is a cross sectional view showing an essential part of a seventh embodiment of the semiconductor device according to the present invention for explaining a seventh embodiment of the production method according to the present invention.

Next, a description will be given of a seventh embodiment of the production method and a seventh embodiment of the semiconductor device according to the present invention, by referring to FIG. 12. In FIG. 12, those parts which are the same as those corresponding parts in FIGS. 2 through 11 are designated by the same reference numerals, and a description thereof will be omitted.

In FIG. 12, an insulator layer 17 made of SiO$_2$ is formed on the inside of the insulator layer 16. The SOI substrate used in this embodiment is the same as that used in the fifth and sixth embodiments shown in FIGS. 10 and 11, however, the inside of the trench 5 is covered by two layers of insulators, that is, the insulator layer 16 and the insulator layer 17. By the provision of the insulator layers 16 and 17, the withstand voltage of the insulator layer is further improved compared to the sixth embodiment. The withstand voltage of the insulator layer can be further improved by increasing the thickness of the insulator layer 16, however, the insulator layer 16 itself becomes the cause of the stress and it is undesirable to make the insulator layer 16 thick.

Figure 13:
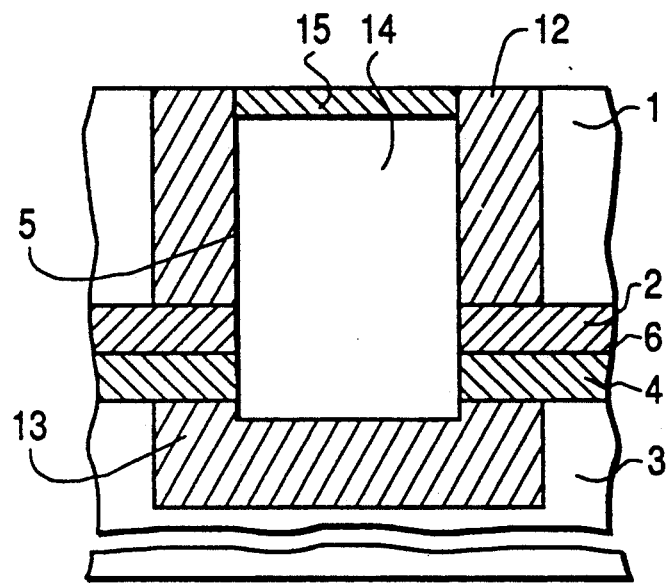
FIG. 13 is a cross sectional view showing an essential part of an eighth embodiment of the semiconductor device according to the present invention for explaining an eighth embodiment of the production method according to the present invention.

Next, a description will be given of an eighth embodiment of the production method and an eighth embodiment of the semiconductor device according to the present invention, by referring to FIG. 13. In FIG. 13, those parts which are the same as those corresponding parts in FIGS. 2 through 12 are designated by the same reference numerals, and a description thereof will be omitted.

The SOI substrate used in this embodiment is the same as that used in the fifth, sixth and seventh embodiments shown in FIGS. 10, 11 and 12. However, the trench 5 penetrates the insulator layer 4 and reaches the base substrate 3 as shown in FIG. 13. When this trench 5 shown in FIG. 13 is compared with the trench shown in FIG. 10, 11 or 12, the stress of the trench 5 itself is spread to the base substrate 3 in FIG. 13 because the trench 5 reaches the base substrate 3. As a result, it is possible to reduce the stress on the active substrate 1.

The trench isolation shown is the standard type which is often used in semiconductor devices.

Figure 14:
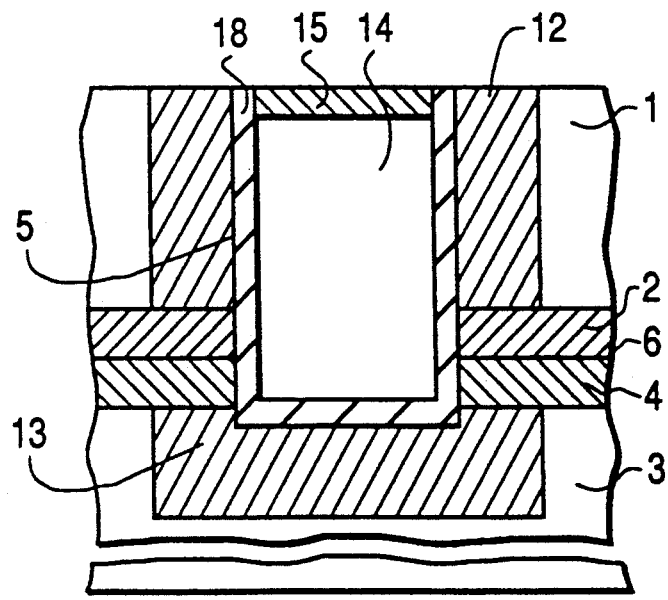
FIG. 14 is a cross sectional view showing an essential part of a ninth embodiment of the semiconductor device according to the present invention for explaining a ninth embodiment of the production method according to the present invention.

Next, a description will be given of a ninth embodiment of the production method and a ninth embodiment of the semiconductor device according to the present invention, by referring to FIG. 14. In FIG. 14, those parts which are the same as those corresponding parts in FIGS. 2 through 13 are designated by the same reference numerals, and a description thereof will be omitted.

In FIG. 14, an insulator layer 18 made of Si$_3$N$_4$ is formed on the inside of the trench 5. The SOI substrate used in this embodiment is also the same as that used in the embodiment shown in FIG. 13. However, in this embodiment, the inside of the trench 15 is covered by the insulator layer 18. Hence, the withstand voltage of the insulator layer is improved compared to the embodiment shown in FIG. 13.

Figure 15:
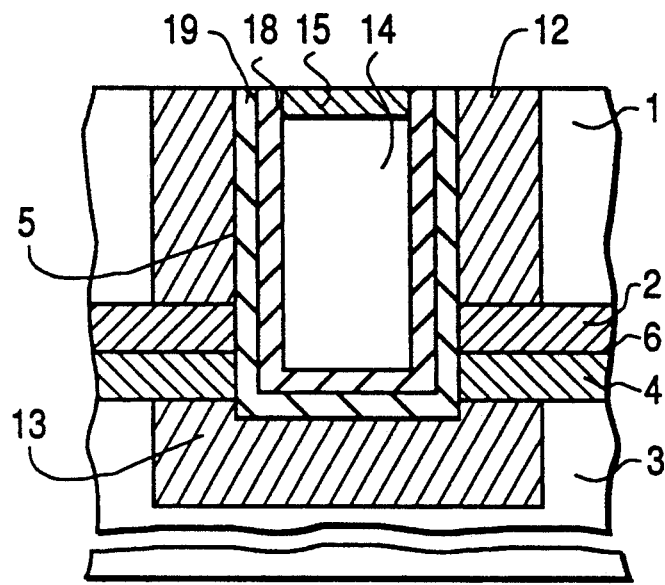
FIG. 15 is a cross sectional view showing an essential part of a tenth embodiment of the semiconductor device according to the present invention for explaining a tenth embodiment of the production method according to the present invention.

Next, a description will be given of a tenth embodiment of the production method and a tenth embodiment of the semiconductor device according to the present invention, by referring to FIG. 15. In FIG. 15, those parts which are the same as those corresponding parts in FIGS. 2 through 14 are designated by the same reference numerals, and a description thereof will be omitted.

In FIG. 15, an insulator layer 19 made of $SiO_2$ is formed on the inside of the trench 5, and the insulator layer 18 is formed on the the insulator layer 19. The SOI substrate used in this embodiment is also the same as that used in the embodiments shown in FIGS. 13 and 14. However, in this embodiment, the inside of the trench 15 is covered by two layers of insulators, that is, the insulator layer 19 and the insulator layer 18. As a result, the withstand voltage of the insulator layer is further improved compared to the embodiment shown in FIG. 13.

Figure 16:
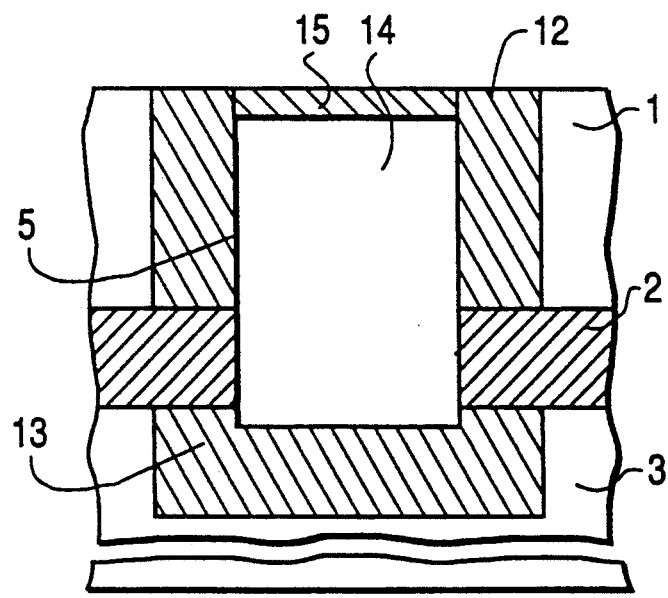
FIG. 16 is a cross sectional view showing an essential part of an eleventh embodiment of the semiconductor device according to the present invention for explaining an eleventh embodiment of the production method according to the present invention.

Next, a description will be given of an eleventh embodiment of the production method and an eleventh embodiment of the semiconductor device according to the present invention, by referring to FIG. 16. In FIG. 16, those parts which are the same as those corresponding parts in FIGS. 2 through 15 are designated by the same reference numerals, and a description thereof will be omitted.

This embodiment uses the SOI substrate which is obtained by bonding the active substrate 1 which has the insulator layer 2 to the base substrate 3 which does not have the insulator layer 4. In other words, the bonding surface is located between the active substrate 1 and the insulator layer 2. Alternatively, the SOI structure may be made by SIMOX or recrystallization. In addition, the trench 5 penetrates the insulator layer 2 and reaches the base substrate 3. When this SOI substrate is compared with the SOI substrate shown in FIG. 8 the stress of the trench 5 spreads to the lower side of the insulator layer 2 and the stress is small at the active region, that is, the upper side of the insulator layer 2.

Similarly as in the case of the trench isolation structure shown in FIG. 10 or 13, the trench isolation shown is the standard type which is often used in semiconductor devices.

Figure 17:
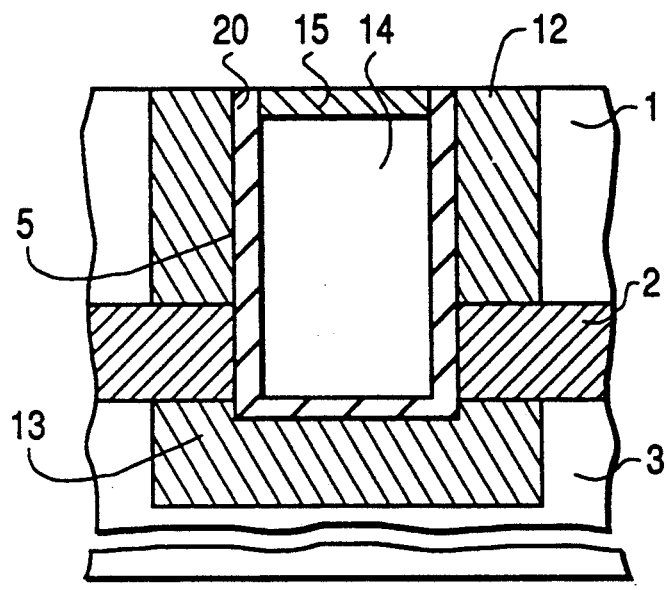
FIG. 17 is a cross sectional view showing an essential part of a twelfth embodiment of the semiconductor device according to the present invention for explaining a twelfth embodiment of the production method according to the present invention.

Next, a description will be given of a twelfth embodiment of the production method and a twelfth embodiment of the semiconductor device according to the present invention, by referring to FIG. 17. In FIG. 17, those parts which are the same as those corresponding parts in FIGS. 2 through 16 are designated by the same reference numerals, and a description thereof will be omitted.

In this embodiment, an insulator layer 20 made of $Si_3N_4$ is formed on the inside of the trench 5. The SOI substrate used in this embodiment is the same as that used in the embodiment shown in FIG. 16. However, the inside of the trench is covered by the insulator layer 20. By the provision of the insulator layer 20, it is possible to improve the withstand voltage of the insulator layer compared to the embodiment shown in FIG. 16.

Figure 18:
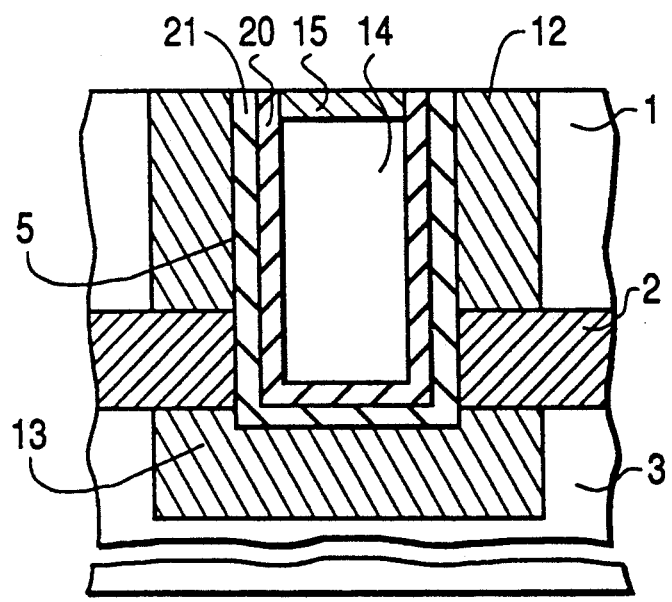
FIG. 18 is a cross sectional view showing an essential part of a thirteenth embodiment of the semiconductor device according to the present invention for explaining a thireteenth embodiment of the production method according to the present invention.

Next, a description will be given of a thirteenth embodiment of the production method and a thirteenth embodiment of the semiconductor device according to the present invention, by referring to FIG. 18. In FIG. 18, those parts which are the same as those corresponding parts in FIGS. 2 through 17 are designated by the same reference numerals, and a description thereof will be omitted.

In this embodiment, an insulator layer 21 which is made of $SiO_2$ is formed on the inside of the trench 5, and the insulator layer 20 is formed on the the insulator layer 21. The SOI substrate used in this embodiment is the same as that used in the embodiments shown in FIGS. 16 and 17. However, the inside of the trench 5 is covered by two layers of insulators, that is, the insulator layer 21 and the insulator layer 20. As a result, it is possible to further improve the withstand voltage of the insulator layer compared to the embodiment shown in FIG. 16.

Figure 19:
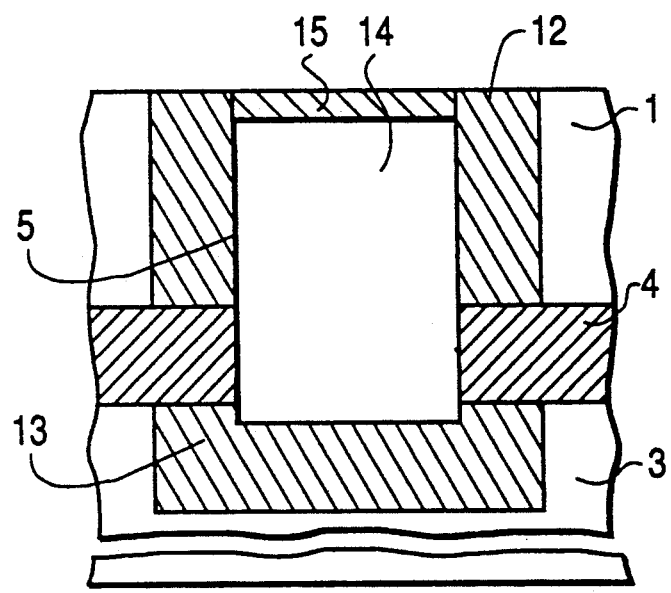
FIG. 19 is a cross sectional view showing an essential part of a fourteenth embodiment of the semiconductor device according to the present invention for explaining a fourteenth embodiment of the production method according to the present invention.

Next, a description will be given of a fourteenth embodiment of the production method and a fourteenth embodiment of the semiconductor device according to the present invention, by referring to FIG. 19. In FIG. 19, those parts which are the same as those corresponding parts in FIGS. 2 through 18 are designated by the same reference numerals, and a description thereof will be omitted.

This embodiment uses the SOI substrate which is obtained by bonding the active substrate 1 which does not have the insulator layer 4 to the base substrate 3 which has the insulator layer 4. In other words, the bonding surface is located between the base substrate 3 and the insulator layer 4. Alternatively, the SOI structure may be made by SIMOX or recrystallization. In addition, the trench 5 penetrates the insulator layer 4 and reaches the base substrate 3. When this SOI substrate is compared with the SOI substrate shown in FIG. 13, the bonding strength between the Si layer and the $SiO_2$ layer is stronger than that between two $SiO_2$ layers, and the insulator layer 4 is unlikely to separate from the substrates 1 and 3.

Similarly as in the case of the trench isolation structure shown in FIG. 10, 13 or 16, the trench isolation shown is the standard type which is often used in semiconductor devices.

Figure 20:
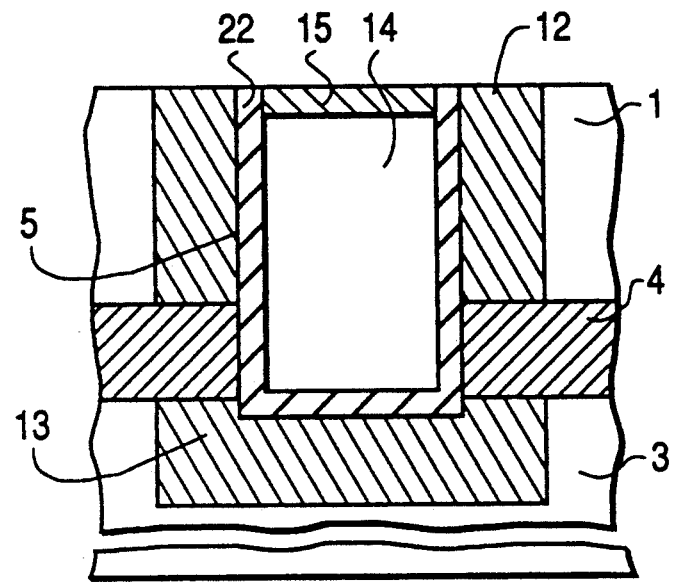
FIG. 20 is a cross sectional view showing an essential part of a fifteenth embodiment of the semiconductor device according to the present invention for explaining a fifteenth embodiment of the production method according to the present invention.

Next, a description will be given of a fifteenth embodiment of the production method and a fifteenth embodiment of the semiconductor device according to the present invention, by referring to FIG. 20. In FIG. 20, those parts which are the same as those corresponding parts in FIGS. 2 through 19 are designated by the same reference numerals, and a description thereof will be omitted.

In this embodiment, an insulator layer 22 which is made of $Si_3N_4$ is formed on the inside of the trench 5. The SOI substrate used in this embodiment is the same as that used in the embodiment shown in FIG. 19. However, the inside of the trench 5 is covered by the insulator layer 22. Compared to the embodiment shown in FIG. 19, it is possible to further improve the withstand voltage of the insulator layer.

Figure 21:
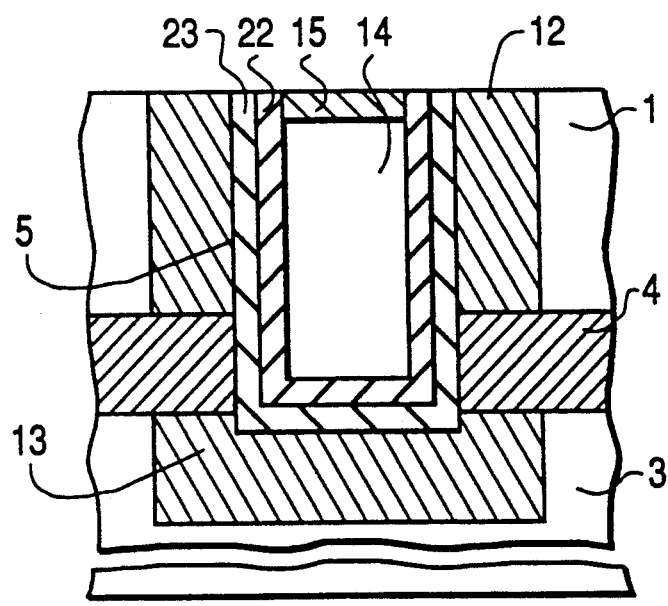
FIG. 21 is a cross sectional view showing an essential part of a sixteenth embodiment of the semiconductor device according to the present invention for explaining a sixteenth embodiment of the production method according to the present invention.

Next, a description will be given of a sixteenth embodiment of the production method and a sixteenth embodiment of the semiconductor device according to the present invention, by referring to FIG. 21. In FIG. 21, those parts which are the same as those corresponding parts in FIGS. 2 through 20 are designated by the same reference numerals, and a description thereof will be omitted.

In this embodiment, an insulator layer made of $SiO_2$ is formed on the inside of the trench 5, and the insulator layer 22 is formed on the insulator layer 23. The SOI substrate used in this embodiment is the same as that used in the embodiments shown in FIGS. 19 and 20. However, the inside of the trench 5 is covered by two layers of insulators, that is, the insulator layer 23 and the insulator layer 22. As a result, it is possible to further improve the withstand voltage of the insulator layer compared to the embodiment shown in FIG. 19.

In the described embodiments, the present invention is applied to the semiconductor device having the SOI structure. However, the present invention is of course also applicable to a semiconductor device having a semiconductor-on-insulator structure where problems similar to those described in conjunction with FIG. 1 occur.

Further, the present invention is not limited to these embodiments, but various variations and modifications may be made without departing from the scope of the present invention.

I claim:

1. A semiconductor device comprising:
   a first substrate made of a semiconductor;
   a first insulator layer which is formed on said first substrate;
   a second substrate made of a semiconductor and formed on said first insulator layer, said second substrate having a top surface;
   a trench which extends from the top surface of said second substrate into at least a part of said first insulator layer, said trench having a side wall on a vertical portion of said trench and having a bottom, said first insulator at the bottom of said trench being thinner than at other portions of said trench; and
   a second insulator layer which substantially defines the side wall on the vertical portion of said trench and contacts said first insulator layer at the bottom of said trench.

2. The semiconductor device as claimed in claim 1, wherein said first and second semiconductor substrates are made of silicon and said first insulator layer is made of silicon dioxide.

3. The semiconductor device as claimed in claim 2, wherein said second insulator layer is made of silicon dioxide.

4. The semiconductor device as claimed in claim 1, wherein said semiconductor device further comprises a third insulator layer which substantially defines the bottom of said trench on a side of said first substrate, said second insulator layer defining the side wall of said trench on a side of said second substrate.

5. The semiconductor device as claimed in claim 4, wherein said first and second substrates are made of silicon, and said second and third insulator layers respectively are oxidized portions of said first and second substrates.

6. The semiconductor device as claimed in claim 4, which further comprises a filling material which fills the inside of said trench, and a fourth insulator layer which covers an exposed top of said filling material and connects to said second insulator layer.

7. The semiconductor device as claimed in claim 4, which further comprises a fourth insulator layer which covers the inside of said trench, a filling material which is formed on said fourth layer and fills the inside of said trench, and a fifth insulator layer which covers an exposed top of said filling material and connects to said fourth insulator layer.

8. The semiconductor device as claimed in claim 4, which further comprises a fourth insulator layer which covers the inside of said trench, a fifth insulator layer which is formed on said fourth insulator layer, a filling material which is formed on said fifth layer and fills the inside of said trench, and a sixth insulator layer which covers an exposed top of said filling material and connects to said fifth insulator layer.

9. The semiconductor device as claimed in claim 8, wherein said fourth and fifth insulator layers are made of mutually different materials.

10. The semiconductor device as claimed in claim 1, wherein said first insulator layer is made up of top and bottom insulator layers which are bonded together, said top insulator layer being initially formed on said second substrate, said bottom insulator layer being initially formed on said first substrate, said trench extending from the top surface of said second substrate to at least a part of said top insulator layer.

11. The semiconductor device as claimed in claim 10, wherein said trench extends from the top surface of said second substrate to a part of said bottom insulator layer.

12. The semiconductor device as claimed in claim 10, wherein said first and second substrates are made of silicon and said first insulator layer is made of silicon dioxide.

13. The semiconductor device as claimed in claim 12, wherein said second insulator layer is made of silicon dioxide.

14. The semiconductor device as claimed in claim 10, wherein said trench extends from the top surface of said second substrate to a part of said first substrate at a bottom part of said trench by penetrating the top and bottom insulator layers of said first insulator layer, and said semiconductor device further comprises a third insulator layer which substantially defines the bottom part of said trench on the side of said first substrate, said second insulator layer defining the side wall of said trench on the side of said second substrate.

15. The semiconductor device as claimed in claim 14, wherein said first and second substrates are made of silicon, and said second and third insulator layers respectively are oxidized portions of said first and second substrates.

16. The semiconductor device as claimed in claim 14, which further comprises a filling material which fills the inside of said trench, and a fourth insulator layer which covers an exposed top of said filling material and connects to said second insulator layer.

17. The semiconductor device as claimed in claim 14, which further comprises a fourth insulator layer which covers the inside of said trench, a filling material which is formed on said fourth layer and fills the inside of said trench, and a fifth insulator layer which covers an exposed top of said filling material and connects to said fourth insulator layer.

18. The semiconductor device as claimed in claim 14, which further comprises a fourth insulator layer which covers the inside of said trench, a fifth insulator layer which is formed on said fourth insulator layer, a filling material which is formed on said fifth layer and fills the inside of said trench, and a sixth insulator layer which covers an exposed top of said filling material and connects to said fifth insulator layer.

19. The semiconductor device as claimed in claim 18, wherein said fourth and fifth insulator layers are made of mutually different materials.

* * * * *

UNITED STATES PATENT AND TRADEMARK OFFICE
CERTIFICATE OF CORRECTION

PATENT NO. : 5,250,836
DATED : October 5, 1993
INVENTOR(S) : Miura et al.

It is certified that error appears in the above-indentified patent and that said Letters Patent is hereby corrected as shown below:

Col. 5, line 23, "separated" should be --separate--.

Col. 5, line 44, "Step 4-(1)" should be moved out of the formula block and delete ":".

Col. 5, line 48, "When" should be --when--.

Col. 5, line 64, "separated" should be --separate--.

Signed and Sealed this

Twenty-third Day of August, 1994

Attest:

BRUCE LEHMAN

Attesting Officer    Commissioner of Patents and Trademarks